US012716023B2

(12) United States Patent
Yan et al.

(10) Patent No.: US 12,716,023 B2
(45) **Date of Patent: *Aug. 25, 2026**

(54) QUANTUM DOT, FORMING METHOD THEREOF AND LIGHT-EMITTING DEVICE INCLUDING THE SAME

(71) Applicant: Lextar Electronics Corporation, Hsinchu (TW)

(72) Inventors: Pei Cong Yan, Hsinchu (TW); Chai Chun Hsieh, Hsinchu (TW); Huei Ping Wang, Hsinchu (TW); Hung-Chun Tong, Hsinchu (TW); Yu-Chun Lee, Hsinchu (TW)

(73) Assignee: LEXTAR ELECTRONICS CORPORATION, Hsinchu (TW)

( * ) Notice: Subject to any disclaimer, the term of this patent is extended or adjusted under 35 U.S.C. 154(b) by 879 days.

This patent is subject to a terminal disclaimer.

(21) Appl. No.: 17/816,077

(22) Filed: Jul. 29, 2022

(65) Prior Publication Data

US 2023/0279291 A1 Sep. 7, 2023

(30) Foreign Application Priority Data

Mar. 7, 2022 (CN) ........................ 202210216097.4

(51) Int. Cl.

| | |
|---|---|
| ***C09K 11/02*** | (2006.01) |
| ***C09K 11/88*** | (2006.01) |
| ***H10H 20/851*** | (2025.01) |
| *B82Y 20/00* | (2011.01) |
| *B82Y 40/00* | (2011.01) |
| *H10H 20/01* | (2025.01) |

(52) U.S. Cl.

CPC .......... *C09K 11/025* (2013.01); *C09K 11/883* (2013.01); *H10H 20/8512* (2025.01); *B82Y 20/00* (2013.01); *B82Y 40/00* (2013.01); *H10H 20/0361* (2025.01)

(58) Field of Classification Search

CPC ........... H10H 20/8512; H10H 20/0361; C09K 11/883; B82Y 20/00; B82Y 40/00

See application file for complete search history.

(56) References Cited

U.S. PATENT DOCUMENTS

| | | | |
|---|---|---|---|
| 7,919,342 | B2 | 4/2011 | Cok |
| 2019/0086733 | A1 | 3/2019 | Min et al. |

(Continued)

FOREIGN PATENT DOCUMENTS

| | | | |
|---|---|---|---|
| CN | 205575624 U | * | 9/2016 |
| CN | 107298974 A | | 10/2017 |

(Continued)

OTHER PUBLICATIONS

Chinese language office action dated Oct. 27, 2023, issued in application No. TW 112103296.

(Continued)

*Primary Examiner* — Mohammad M Choudhry

(74) *Attorney, Agent, or Firm* — McClure, Qualey & Rodack, LLP

(57) ABSTRACT

A quantum dot is disclosed. The quantum dot includes: a core, a first shell, and a second shell. The first shell is discontinuously distributed around the core surface. The second shell is between the core and the first shell and encapsulates the core. The second shell has an irregularly shaped outer surface.

11 Claims, 10 Drawing Sheets

1

(56) References Cited

U.S. PATENT DOCUMENTS

| | | | | |
|---|---|---|---|---|
| 2019/0177612 | A1* | 6/2019 | Juang | C09K 11/883 |
| 2020/0203561 | A1* | 6/2020 | Chen | H10H 20/812 |
| 2021/0126159 | A1 | 4/2021 | Cho | |

FOREIGN PATENT DOCUMENTS

| | | | | | |
|---|---|---|---|---|---|
| CN | 110257049 | A | | 9/2019 | |
| CN | 110373177 | A | | 10/2019 | |
| GB | 2445579 | A | * | 7/2008 | G01N 33/544 |
| TW | 1620809 | B | | 4/2018 | |
| TW | 202039360 | A | | 11/2020 | |
| WO | WO-2015058564 | A1 | * | 4/2015 | C09K 19/54 |

OTHER PUBLICATIONS

Chinese language office action dated Jun. 11, 2025, issued in application No. CN 202210216097.4.

Yang, J., et al.; "Tunable luminescence of spherical CdSe/ZnS and tetrahedron CdSe/Cd1xZnxS core/shell quantum dots created using same cores;" Materials Chemistry and Physics 135; Sep. 2012; pp. 486-492.

* cited by examiner

QUANTUM DOT, FORMING METHOD THEREOF AND LIGHT-EMITTING DEVICE INCLUDING THE SAME

CROSS REFERENCE TO RELATED APPLICATIONS

This application claims priority of China Patent Application No. 2022102160974, filed on Mar. 7, 2022, the entirety of which is incorporated by reference herein.

BACKGROUND OF THE INVENTION

Field of the Invention

The present invention relates to a quantum dot, a forming method thereof and a light-emitting device including the same, and, in particular, it relates to a quantum dot with excellent moisture and oxygen resistance properties, a forming method thereof and a light-emitting device including the same.

Description of the Related Art

Quantum dots (QDs) are nanoscale semiconductor materials. Quantum dots usually have spherical or sphere-like crystal structures formed by several hundred to several thousand atoms. Quantum dots are wavelength conversion materials that have the advantage of high color saturation and are therefore highly advantageous for Wide Color Gamut (WCD) display technology.

However, quantum dots are susceptible to oxidation in the presence of water and oxygen. Oxidation of quantum dots may cause problems such as a shifting of their luminous wavelengths, a widening of the full width at half maximum of the luminous spectrum, and a decaying of quantum efficiency. Therefore, there is still a need to find quantum dots with better resistance or tolerance to oxygen and moisture.

BRIEF SUMMARY OF THE INVENTION

In view of the above needs, the present disclosure provides a quantum dot with better resistance or tolerance to oxygen or moisture.

An embodiment of the present invention provides a quantum dot comprising a core, a first shell, and a second shell. The first shell is discontinuously distributed around a core surface. The core surface is defined as the surface of the core. The second shell is located between the core and the first shell. The second shell encapsulates the core. The second shell has an irregularly shaped outer surface.

In some embodiments, the quantum dot further comprises a gap between the first shell and the second shell. The gap is greater than or equal to 0 nm and less than or equal to 10 nm.

In some embodiments, the sum of the thickness of the first shell, the thickness of the second shell, and the gap is greater than 0 nm and less than or equal to 35 nm.

In some embodiments, the irregularly shaped outer surface of the second shell is a concave-and-convex outer surface, and the height difference between the lowest point and the highest point in the concave-and-convex outer surface is greater than 0 nm and less than or equal to 5 nm.

In some embodiments, the concave-and-convex outer surface has a recessed portion with a recessed width, and the recessed width is greater than 0 nm and less than or equal to 10 nm.

In some embodiments, the first shell includes a plurality of stacked particles.

In some embodiments, the quantum dot further comprises a ligand on the outer surface of the second shell.

In some embodiments, the quantum dot further comprises a first transparent layer encapsulating the second shell.

In some embodiments, the first transparent layer may have an irregularly shaped outer surface.

In some embodiments, the quantum dot further comprises a second transparent layer in the first transparent layer and encapsulating the first shell.

In some embodiments, the first shell and the second shell are made of the same materials.

An embodiment of the present invention provides a method of forming quantum dots, comprising: providing a core solution, the core solution comprises a plurality of cores; providing a shell precursor solution to the core solution to form a quantum dot precursor solution; heating the quantum dot precursor solution to synthesize quantum dots, wherein the shell precursor solution is injected into the core solution at an injection rate, and the injection rate of the shell precursor solution is 0.016-1.6 eq/min when the core content in the core solution is counted as 1 equivalent.

In some embodiments, the step of providing a shell precursor solution to the core solution comprises: injecting a first shell precursor solution at a first injection rate, and injecting a second shell precursor solution at a second injection rate, wherein the first injection rate is 0.016-1.6 eq/min and the second injection rate is 0.016-1.6 eq/min when the core content in the core solution is counted as 1 equivalent, and wherein the first injection rate is greater than or equal to the second injection rate.

In some embodiments, the method of forming quantum dots further comprises performing a purification process after synthesizing the quantum dots.

In addition, an embodiment of the present invention provides a light-emitting device, comprising: a light source emitting a first light; and a wavelength conversion component absorbing part of the first light and converting the part of the first light into a second light, wherein the wavelength conversion component comprises the quantum dots mentioned above.

According to the embodiments of the present disclosure mentioned above, the quantum dots of the present disclosure include a second shell having an irregularly shaped outer surface and a first shell discontinuously distributed around the core surface of the core. The quantum dots disclosed herein have the shell structure mentioned above, so they can have higher resistance to potentially damaging factors in the environment, such as moisture, oxygen and free radicals. Therefore, the quantum dots disclosed herein may have better reliability and a longer luminous life. The method of forming quantum dots disclosed herein can form quantum dots with better reliability and longer luminescence life. The luminescent device including the above quantum dots may also have better reliability and longer luminescence life.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF THE INVENTION

Figure 1:
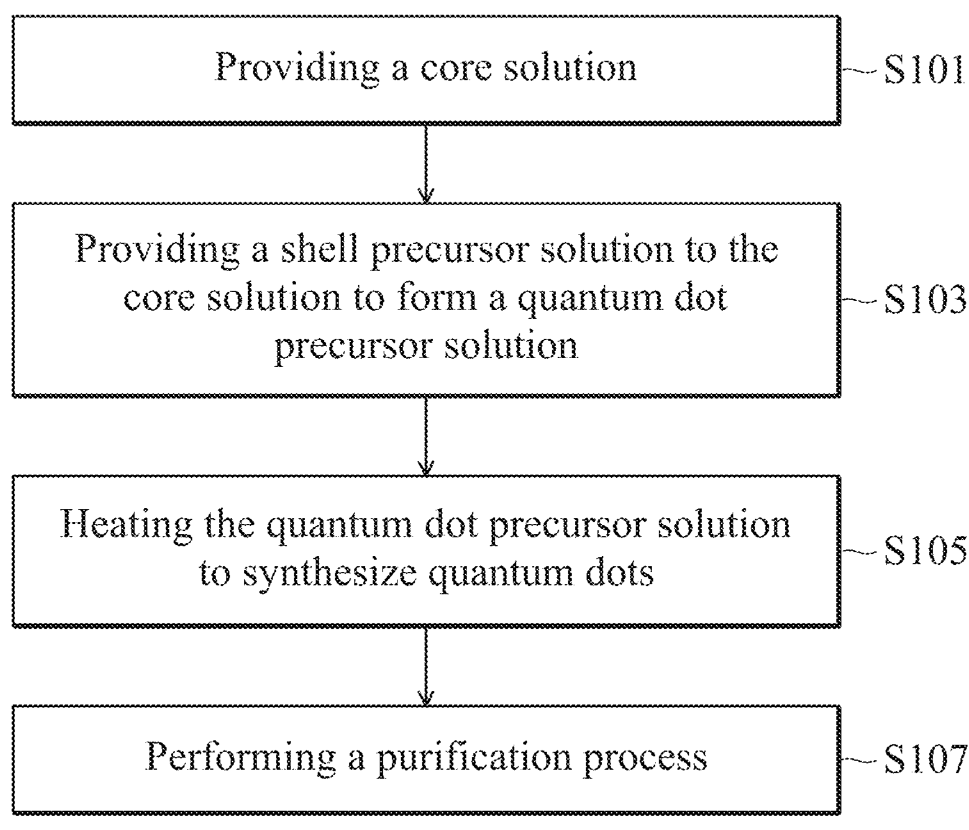
FIG. 1 illustrates a flowchart of a method of forming quantum dots according to some embodiments of the present disclosure.

The following description is made for the purpose of illustrating the general principles of the invention and should not be taken in a limiting sense. The scope of the invention is best determined by reference to the appended claims.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

It should be understood that additional operations can be provided before, during, and/or after the stages described in these embodiments. Some of the stages that are described can be replaced or eliminated for different embodiments.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Here, the terms "about", "approximately", "substantially" usually means within 20%, within 10%, within 5%, within 3%, within 2%, within 1% or within 0.5% of a given value or range. Here, the given value is an approximate number. That is, in the absence of a specific description of "about", "approximately", "substantially", the meaning of "about", "approximately", "substantially" may still be implied. Besides, the expression "a-b" indicates the range includes values greater than or equal to a and values less than or equal to b.

Unless otherwise defined, all terms (including technical and scientific terms) used herein have the same meaning as commonly understood by a person skilled in the art to which the invention pertains. It will be further understood that terms, such as those defined in commonly used dictionaries, should be interpreted as having a meaning consistent with the relevant technology and the context or background of this disclosure and will not be interpreted in an idealized or overly formal sense unless expressly so defined herein.

Different embodiments disclosed below may reuse the same reference symbols and/or labels. These repetitions are for the purpose of simplicity and clarity and are not intended to limit the specific relationship between the various embodiments and/or structures discussed below.

Some embodiments of the present disclosure provide a method of forming quantum dots. FIG. 1 illustrates a flowchart of a forming method 1 of quantum dots according to some embodiments of the present disclosure. As shown in FIG. 1, the forming method 1 of quantum dots includes: a step S101 of providing a core solution, a step S103 of providing a shell precursor solution to the core solution to form a quantum dot precursor solution, and a step S105 of heating the quantum dot precursor solution to synthesize quantum dots.

The core solution provided in the step S101 includes a plurality of cores. In some embodiments, the step S101 of providing a core solution comprises a step of mixing a first core precursor solution and a second core precursor solution to form a core precursor mixture and a step of heating the core precursor mixture to form a core. In some embodiments, the first core precursor solution and the second core precursor solution may comprise any material which can form a core comprising an inorganic conductor material or an inorganic semiconductor material after the mixing and heating steps. In some embodiments, the first core precursor solution and/or the second core precursor solution may comprise inorganic semiconductor materials of Group II, Group III, Group IV, Group V, Group VI, or any combination thereof.

In the step S103, the shell precursor solution is provided to the core solution obtained from the step S101 to form the quantum dot precursor solution. In some embodiments, the shell precursor solution may comprise a material that can form a shell encapsulating the core in the step S101 in subsequent steps. The shell has the same material as the core in the step S101 or a material having lattice matching the lattice of the core in the step S101. In some embodiments, the shell precursor solution may comprise inorganic semiconductor materials of Group II, Group III, Group IV, Group V, Group VI, or any combination thereof. The equivalent ratio of core solution to shell precursor solution may be about 1:100-1:1. In some embodiments, the step of providing the shell precursor solution into the core solution to form the quantum dot precursor solution in the step S103 comprises slowly injecting the shell precursor solution into the core solution obtained from the step S101 at an injection rate within an injection time of about 1 to 2 hours. The injection rate of the shell precursor solution is about 0.016-1.6 eq/min when the core content in the core solution is counted as 1 equivalent. In some embodiments, the injection rate of the shell precursor solution may be about 0.05-1.6 eq/min, about 0.06-1.6 eq/min, about 0.05-1.55 eq/min, about 0.06-1.55 eq/min, about 0.05-1.5 eq/min, or about 0.06-1.5 eq/min. When the injection rate of the shell precursor solution is about 0.016-1.6 eq/min, there will be an appropriate reaction time between the molecules in the shell precursor solution and the core solution. Therefore, these molecules can form irregular shells while maintaining the luminescent properties of the quantum dots formed in the subsequent stage by attractive and repulsive forces between them. When the injection rate of the shell precursor solution is less than 0.016 eq/min, the reaction time between the molecules in the shell precursor solution and the core solution may be too long. Therefore, these molecules tend to form bulks and the quantum dots formed in the subsequent step may lose luminescence properties. When the injection rate of the shell precursor solution is greater than about 1.6 eq/min, the forces between the molecules in the shell precursor solution and the core solution and the growth rate of the shells are not balanced. Therefore, the shells formed in the subsequent stages will have large shell gaps and will not be able to cluster around the core, thus failing to form quantum dots that have better resistance or tolerance to environmental damage factors.

In some embodiments, the shell precursor solution may comprise a first shell precursor solution and a second shell precursor solution. In such embodiments, the step S103 may include injecting the first shell precursor solution at a first injection rate, and injecting the second shell precursor solution at a second injection rate. The first injection rate is about 0.016-1.6 eq/min and the second injection rate is about 0.016-1.6 eq/min when the core content in the core solution is counted as 1 equivalent. The first injection rate is greater than or equal to the second injection rate. In some embodiments, the first injection rate may be about 0.1-1.6 eq/min, about 0.15-1.6 eq/min, about 0.2-1.6 eq/min, about 0.3-1.6 eq/min, about 0.15-1.55 eq/min, about 0.2-1.55 eq/min, about 0.3-1.55 eq/min, about 0.15-1.5 eq/min, about 0.2-1.5 eq/min, or about 0.3-1.5 eq/min. In some embodiments, the second injection rate injection may be about 0.05-1.3 eq/min, about 0.05-1.2 eq/min, about 0.05-1.0 eq/min, about 0.06-1.3 eq/min, about 0.06-1.2 eq/min, or about 0.06-1.0 eq/min. In some embodiments, the second shell precursor solution may be injected after the first shell precursor solution is injected, and the first injection rate is greater than or equal to the second injection rate. In some embodiments, the second shell precursor solution may be injected twice, wherein the first shell precursor solution is injected between the twice injections of the second shell precursor solutions, and the first injection rate is greater than or equal to the second injection rate. In some embodiments, the first shell precursor solution and/or the second shell precursor solution may comprise a material that can form a shell encapsulating the core in the step S101 in subsequent steps. The shell has the same material as the core in the step S101 or a material having lattice matching the lattice of the core in the step S101. In some embodiments, the first shell precursor solution and/or the second shell precursor solution may comprise inorganic semiconductor materials of Group II, Group III, Group IV, Group V, Group VI, or any combination thereof.

Figure 2:
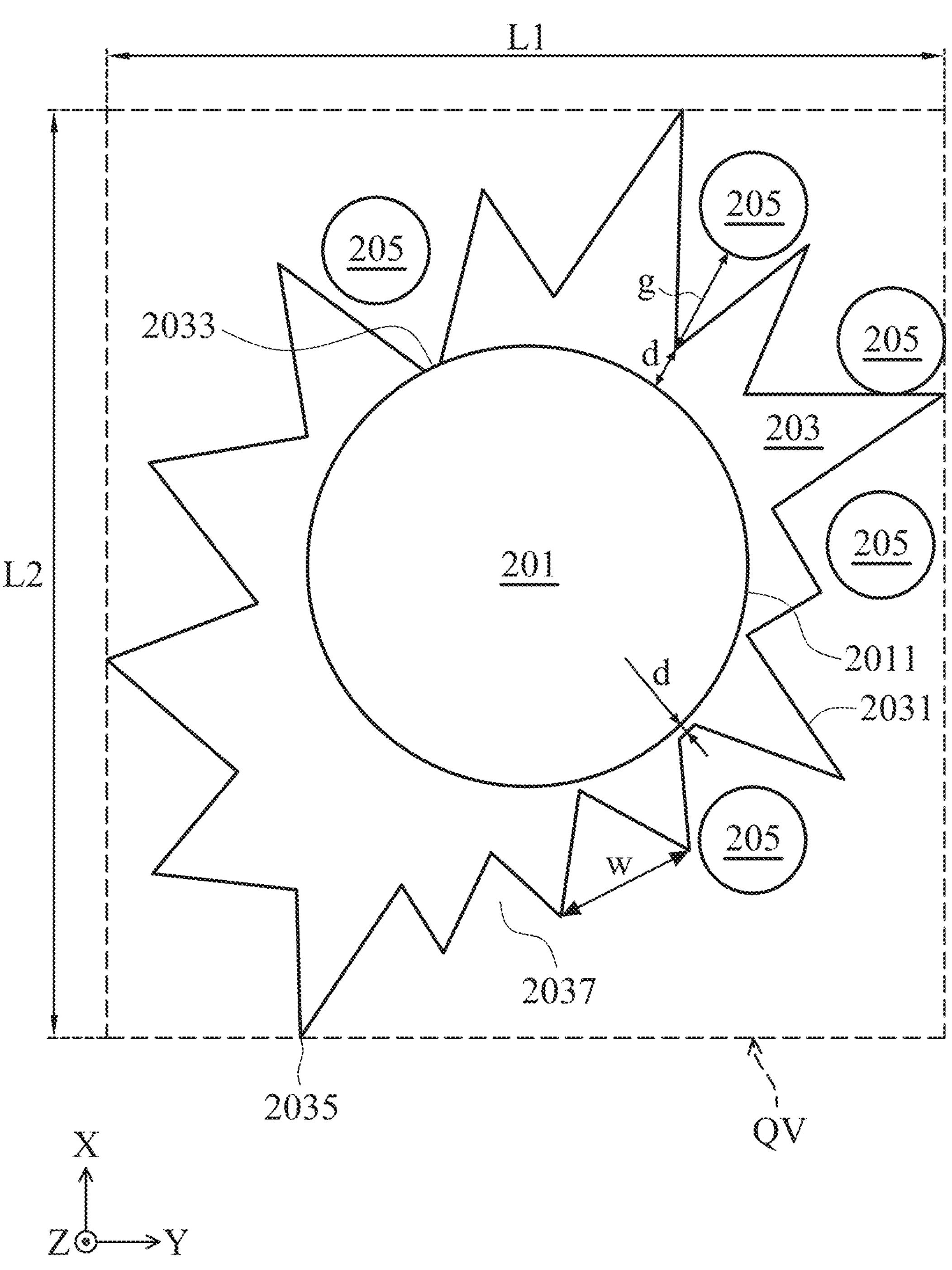
FIG. 2 illustrates a schematic view of a quantum dot according to some embodiments of the present disclosure

In the step S105, the quantum dot precursor solution obtained in the step S103 is heated to synthesize quantum dots. The quantum dots formed in the step S105 are quantum dots having a core-shell structure. In some embodiments, the quantum dots formed in the step S105 have a core-shell structure as shown in FIG. 2. In some embodiments, the method of forming quantum dots further comprises a step S107 of performing a purification process after synthesizing the quantum dots. In some embodiments, the purification process of the step S107 may comprise a step of washing the quantum dot solution containing the quantum dots by an organic solvent and then centrifuging the quantum dot solution to obtain purified quantum dots.

FIG. 2 illustrates a schematic view of a quantum dot 20 according to some embodiments of the present disclosure. As shown in FIG. 2, the quantum dot 20 has a core 201, a first shell 205, and a second shell 203.

The core 201 is a light-emitting core of the quantum dot 20. In some embodiments, an average diameter of the core 201 is greater than or equal to 9 nm and less than or equal to 20 nm. In some embodiments, the core 201 may be composed of an inorganic conductor material or an inorganic semiconductor material. Examples of inorganic semiconductor materials may include, but are not limited to, semiconductor materials of Group II-VI, Group III-V, Group IV-VI, and/or Group IV. Specific examples of inorganic semiconductor materials include, but not limited to, CdSe, CdTe, ZnS, ZnSe, ZnTe, ZnO, HgS, HgSe, HgTe, CdSeS, CdSeTe, CdSTe, ZnSeS, ZnSeTe, ZnSTe, HgSeS, HgSTe HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS HgZnSeTe, HgZnSTe, GaN, GaP, GaAs, GaSb, AlN, AlP, AlAs, AlSb, InN, InP, InAs, InSb, GaNP, GaNAs, GaNSb, GaPAs, GaPSb, AlNP, AlNAs, AlNSb, AlPAs, AlPSb InNP, InNAs, InNSb, InPAs, InPSb, GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb InAlPAs, InAlPSb, SnS, SnSe, SnTe, PbS, PbSe, PbTe, SnSeS, SnSeTe, SnSTe, PbSeS, PbSeTe, PbSTe, SnPbS, SnPbSe, SnPbTe, SnPbSSe, SnPbSeTe, SnPbSTe, $CsPbX_3$ or $Cs_4PbX_6$, in which X is chlorine, bromine, iodine or any combination thereof.

As shown in FIG. 2, the second shell 203 encapsulates the core 201. The second shell 203 has an irregularly shaped outer surface 2031. That is, the outer surface 2031 of the second shell 203 has a plurality of areas with uneven thickness. The area where the thickness of the second shell 203 progressively decreased is defined as a recessed portion, and the area or point in the recessed portion where the thickness is thinnest is defined as a bottom of the recessed portion. The thickness range of the second shell 203 is greater than or equal to 0 nm and less than or equal to 5 nm. The shape of the second shell 203 is irregular. Therefore, when part of the surface of the core 201 is not encapsulated by the second shell 203, the thickness of a part of the second shell corresponding to the unencapsulated part of the surface of the core 201 is 0. For example, in some embodiments, the second shell is greater than or equal to 0 nm and less than or equal to 4 nm, or greater than 0 nm and less than or equal to 3 nm. In some embodiments, the irregularly shaped outer surface 2031 of the second shell 203 has at least one recessed portion. The recessed portion has a recessed width w, as shown in FIG. 2. In some embodiments, the recessed width w corresponds to a distance between two peaks in a region of the second shell 203 (the term "peak" indicates an area or point in the second shell 203 where the thickness of both sides of the area or point are less than that of the area or point). In embodiments where the number of the recessed portions is greater than 2, the recessed widths of recessed portions may be the same or different. As shown in FIG. 2, the outer surface 2031 of the second shell 203 has a plurality of recessed portions 2037, each recessed portions 2307 has a recessed width w which may be the same or different from each other. In some embodiments, the recessed width w is greater than 0 nm and less than or equal to 10 nm. In some embodiments, the recessed width w is greater than 0 nm and less than or equal to 7 nm, greater than 0 nm and less than or equal to 5 nm, or greater than 0 nm and less than or equal to 3 nm. Further, the recessed portion has a bottom. The bottom is an area or point in the recessed portion where the thickness of the second shell 203 is thinnest. There is a distance d between the bottom and the core 201. In embodiments where the number of the recessed portions is greater than 2, the distances d between the bottoms of the recessed portions and the core 201 can be the same or different from each other, as shown in FIG. 2. Among the bottoms of the recessed portion of the second shell 203, the bottom in which the distance d between the bottom of recessed portion and the core 201 is smallest is defined as the lowest point 2033 of the second shell 203. In embodiments where the thickness of the second shell 203 is 0, the distance d is 0. The thickest region or point in the second shell 203 is defined as the highest point 2035. In some embodiments, there is a height difference between the lowest point 2033 and the highest point 2035. The height difference is greater than 0 nm and less than 5 nm.

Figure 3:
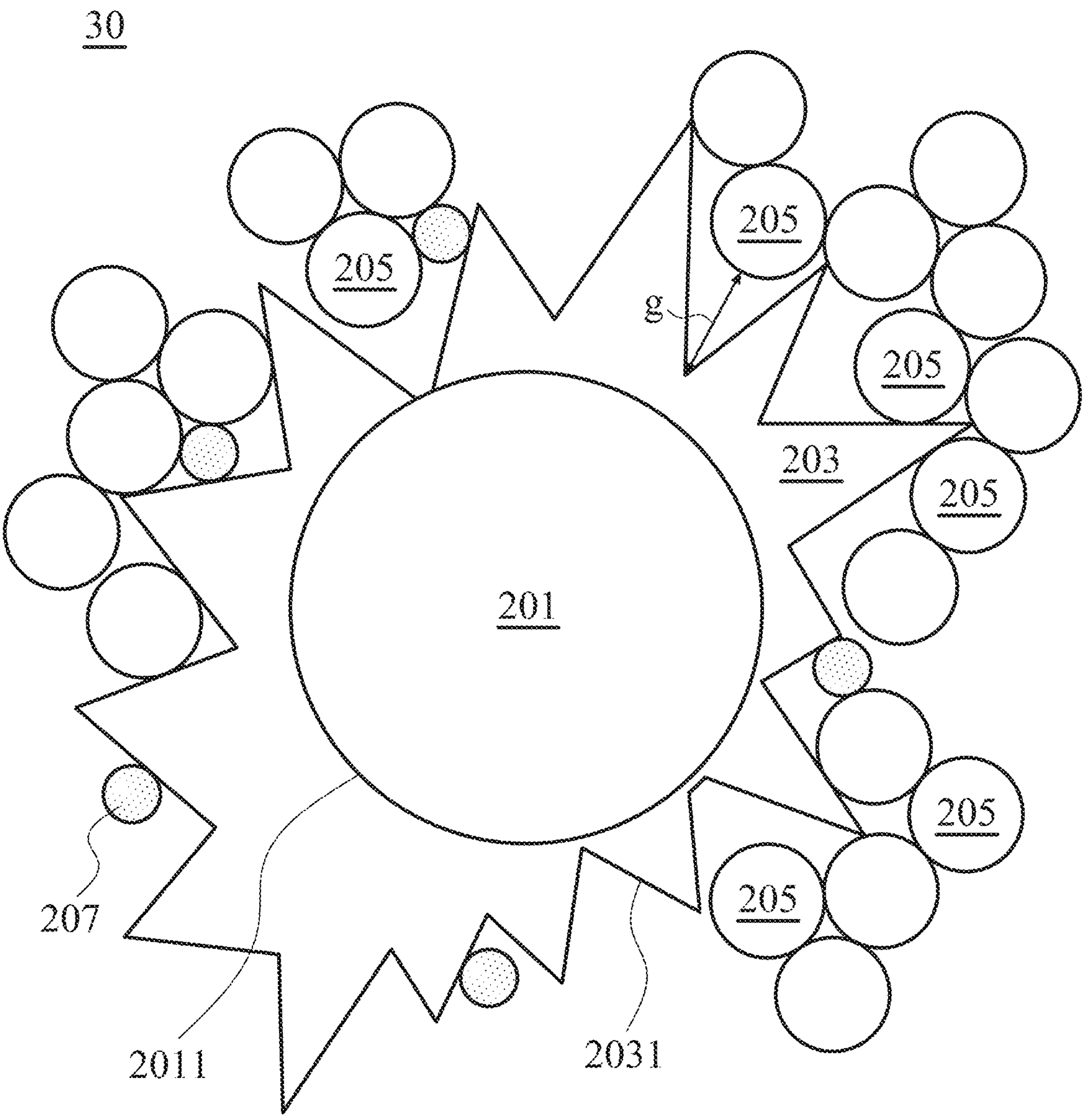
FIG. 3 illustrates a schematic view of a quantum dot according to some embodiments of the present disclosure.

The first shell 205 may be discontinuously distributed around the core surface 2011 of the core 201, and the second shell 203 may be between the core 201 and the first shell 205. As shown in FIG. 2, there may be a gap g between the first shell 205 and the second shell 203, and the first shell 205 is discontinuously distributed around the outer surface 2031 of the second shell 203. In the embodiment in which the thickness of the second shell 203 is 0, the gap g separating the first shell 205 from the second shell 203 is equivalent to the gap between the core 201 and the first shell 205. The gaps g between the first shell 205 and different portions of the outer surface 2031 of the second shell 203 may be the same or different from each other. The gap g may be greater than or equal to 0 nm and less than or equal to 10 nm. In some embodiments, the gap g is greater than or equal to 0 nm and less than or equal to 7 nm, greater than or equal to 0 nm and less than or equal to 5 nm, or greater than or equal to 0 nm and less than or equal to 3 nm. In some embodiments, the first shell 205 may have a particle-like structure. In this embodiment, the first shell 205 may include a plurality of particles around the core 201 and the second shell 203. In some embodiments, the particles of the first shell 205 may be stacked on top of each other, as shown in FIG. 3. In some embodiments, the number of the stacked particles of the first shell 205 is less than or equal to 4. In some embodiments, the number of the stacked particles of the first shell 205 is less than or equal to 3. In this embodiment, the average diameter of the particles of the first shell 205 is greater than 0 nm and less than or equal to 5 nm. For example, in some embodiments, the average diameter of the particles of the first shell 205 is greater than or equal to 1 nm and less than or equal to 5 nm, greater than or equal to 1 nm and less than or equal to 4 nm, greater than or equal to 2 nm and less than or equal to 5 nm, or greater than or equal to 2 nm and less than or equal to 4 nm. FIG. 2 shows an embodiment in which the first shell 205 including a plurality of particles. In this embodiment, there may be a gap g between the outer surface 2031 of the second shell 203 and each particle included in the first shell 205, and the size of the gaps g may be the same or different.

In some embodiments, the sum of the thickness of the first shell 205 and the second shell 203 and the gap g is greater than 0 nm and less than or equal to 35 nm, for example, the sum is greater than 0 nm and less than or equal to 30 nm, greater than 0 nm and less than or equal to 25 nm, greater than 0 nm and less than or equal to 20 nm, greater than or equal to 1 nm and less than or equal to 25 nm, greater than or equal to 2 nm and less than or equal to 25 nm, greater than or equal to 5 nm and less than or equal to 25 nm, etc. For example, in the embodiment that the number of the stacked particles of the first shell 205 is 4, the sum of the thickness of the first shell 205 and the second shell 203 and the gap g is greater than 0 nm and less than or equal to nm. In the embodiment that the number of the stacked particles of the first shell 205 is 3, the sum of the thickness of the first shell 205 and the second shell 203 and the gap g is greater than 0 nm and less than or equal to 30 nm. In the embodiment that the number of the stacked particles of the first shell 205 is 2, the sum of the thickness of the first shell 205 and the second shell 203 and the gap g is greater than 0 nm and less than or equal to 25 nm. In the embodiment that the number of the stacked particles of the first shell 205 is 1, the sum of the thickness of the first shell 205 and the second shell 203 and the gap g is greater than 0 nm and less than or equal to nm. In some embodiments, the first shell 205 and the second shell 203 may include the same material as the core 201 or a material having lattice matching the lattice of the material of the core 201. In some embodiments, the first shell 205 and the second shell 203 may comprise the same material.

Since the first shell 205 of the quantum dot 20 is discontinuously distributed around the core surface 2011 of the core 201 and the second shell 203 has an irregularly shaped outer surface 2031, the quantum dot 20 also has an irregular surface. The expression "maximum diameter length of the quantum dot 20" indicates the longest length of a smallest virtual box encapsulating the quantum dot 20. As shown in FIG. 2, the maximum diameter length of the quantum dot 20 is the longest length among a length (diameter length) L1 in the Y direction, a length (diameter length) L2 in the X direction, and a length in the Z direction (not shown) of the smallest virtual box QV encapsulating the quantum dot 20. In more detail, the maximum diameter L1 and/or L2 includes the maximum diameter of the core 201, the maximum thickness of the second shell 203, the maximum gap between the first shell 205 and the second shell 203, and the maximum diameter of the first shell 205 in which the first shell 205 including a plurality of particles and the number of the stacked particles of the first shell 205 is N. In the embodiment that the number of the stacked particles of the first shell 205 is less than or equal to 4, the maximum diameter L1 and/or L2 may be larger than or equal to 30 nm and smaller than or equal to 90 nm. In the embodiment that the number of the stacked particles of the first shell 205 is less than or equal to 3, the maximum diameter L1 and/or L2 may be larger than or equal to 30 nm and smaller than or equal to 80 nm. In the embodiment that the number of the stacked particles of the first shell 205 is less than or equal to 2, the maximum diameter L1 and/or L2 may be larger than or equal to 30 nm and smaller than or equal to 70 nm. In the embodiment that the number of the stacked particles of the first shell 205 is less than or equal to 1, the maximum diameter L1 and/or L2 may be larger than or equal to 30 nm and smaller than or equal to 60 nm. The minimum diameter L1 and/or L2 includes the minimum diameter of the core 201, the minimum thickness of the second shell 203, and the gap between the first shell 205 and the second shell 203. The minimum diameter L1 and/or L2 does not include the diameter of the particle of the first shell 205 because in this case, the number of the stacked particles of the first shell 205 is 0. Therefore, the minimum diameter L1 and/or L2 may be larger than 9 nm. With the above structure of the first shell 205 and the second shell 203, damage factors presented in the environment that may damage the core 201 of the quantum dots 20 will be trapped in the exterior of the first shell 205 and the second shell 203 or between the first shell 205 and the second shell 203. Therefore, the core 201 of the quantum dots 20 can be prevented from being damaged by the damage factors in the environment, the resistance or tolerance of the quantum dots 20 to the damage factors in the environment could be enhanced, or the reliability or luminous life of the quantum dots 20 could be further enhanced.

FIG. 3 illustrates a schematic view of a quantum dot 30 according to some embodiments of the present disclosure. As shown in FIG. 3, the quantum dot 30 has a core 201, a first shell 205, a second shell 203, and a ligand 207. The composition and structure of the core 201, the first shell 205, and the second shell 203 of the quantum dot 30 are the same as those of the core 201, the first shell 205, and the second shell 203 of the quantum dot 20. The following only describes the ligand 207.

The ligand 207 may be around the outer surface 2031 of the second shell 203 and in the gap g, as shown in FIG. 3. The ligand 207 may further enhance the steric hindrance of the surface of the quantum dot 30 to enhance the ability to trap the environmental damage factors in the exterior of the first shell 205, the second shell 203, and/or the ligand 207 or trap the environmental damage factors between the first shell 205, the second shell 203, and/or the ligand 207. Therefore, the resistance or tolerance of the quantum dots 30 to the environmental damage factors could be enhanced, or the reliability or luminous life of the quantum dots 30 could be further enhanced. The ligand 207 may include a polar ligand or a non-polar ligand. Examples of the ligands 207 may include, but are not limited to, alkylphosphines, alkylamines, arylamines, pyridines, fatty acids, thiophenes, thiol compounds, carbene compounds, or any combination thereof. Examples of the fatty acids may include, but are not limited to, oleyl acid, stearic acid, lauric acid, or any combination thereof. Examples of alkylamines may include, but are not limited to, oleyl amine, octyl amine, dioctyl amine, hexadecyl amine, or any combination thereof. Examples of carbene compounds may include, but are not limited to, 1-octadecene. Examples of alkylphosphines may include, but are not limited to, trioctylphosphine. In some embodiments, the length of the ligand 207 may be about 1-2.5 nm, about 1.2-2.3 nm, about 1.3-2.0 nm, or about 1.5-1.9 nm.

Since the ligand 207 is located in the gap g, the maximum diameter of the quantum dot 30 disclosed herein may be substantially the same as the maximum diameter of the quantum dot 20. In the embodiment that the number of the stacked particles of the first shell 205 is less than or equal to 4, the maximum diameter of the quantum dot 30 may be larger than or equal to nm and smaller than or equal to 90 nm. In the embodiment that the number of the stacked particles of the first shell 205 is less than or equal to 3, the maximum diameter of the quantum dot 30 may be larger than or equal to 30 nm and smaller than or equal to 80 nm. In the embodiment that the number of the stacked particles of the first shell 205 is less than or equal to 2, the maximum diameter of the quantum dot 30 may be larger than or equal to 30 nm and smaller than or equal to 70 nm. In the embodiment that the number of the stacked particles of the first shell 205 is less than or equal to 1, the maximum diameter of the quantum dot 30 may be larger than or equal to 30 nm and smaller than or equal to 60 nm. Similarly, the minimum diameter of the quantum dot 30 may be larger than 9 nm.

Figures 4, 5:
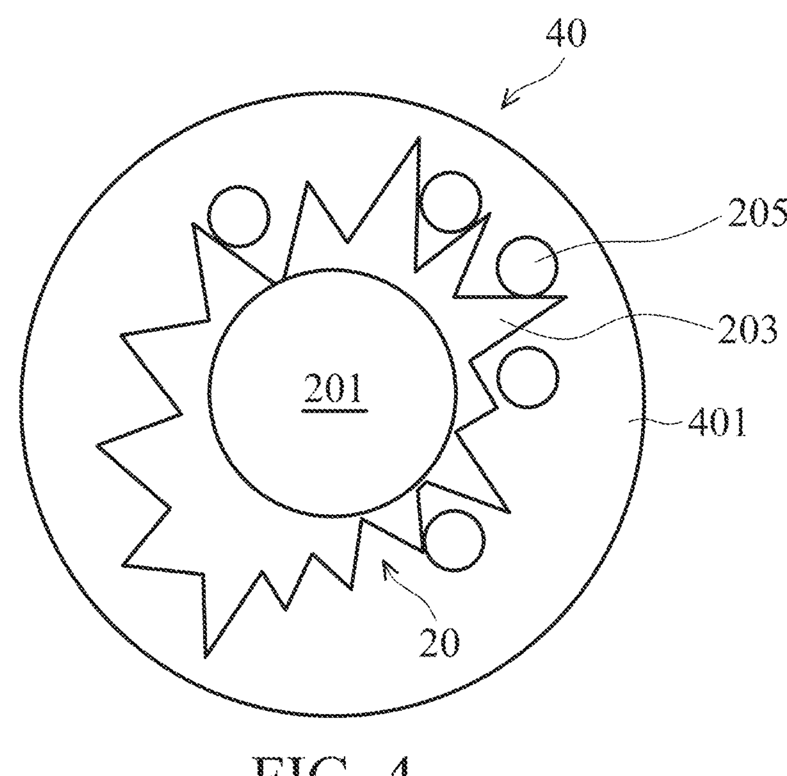
FIG. 4 illustrates a schematic view of a quantum dot according to some embodiments of the present disclosure.
FIG. 5 illustrates a schematic view of a quantum dot according to some embodiments of the present disclosure.

In some embodiments, a transparent layer may be further formed outside of the quantum dot to encapsulate the second shell, as shown in FIG. 4 and FIG. 5. FIG. 4 illustrates a schematic view of a quantum dot 40 according to some embodiments of the present disclosure. FIG. 5 illustrates a schematic view of a quantum dot 50 according to some embodiments of the present disclosure.

The quantum dot 20 shown in FIG. 2 is used in FIG. 4 as an example. In FIG. 4, a transparent layer 401 encapsulating the second shell 203 is further formed over the quantum dot shown in FIG. 2 to form the quantum dot 40, but the present disclosure is not limited to this. In some embodiments, the quantum dots 40 may be formed by further forming a transparent layer 401 encapsulating the second shell 203 over the quantum dot 30 shown in FIG. 3. In some embodiments, the transparent layer 401 may encapsulate both the first shell 205 and the second shell 203 and forms a spherical structure as shown in FIG. 4. The transparent layer 401 may comprise oxides. Examples of the oxides may include, but are not limited to, silicon oxides, aluminum oxides, or any combination thereof. In some embodiments, the transparent layer 401 may be about 0-25 nm thick. In some embodiments, the spherical structure may have a particle size greater than or equal to 9 nm and less than or equal to 140 nm, i.e., an average diameter of about 9-140 nm. In some embodiments, the spherical structure may have an average diameter of about 12-130 nm, about 15-130 nm, about 20-125 nm, about 25-100 nm, about 30-90 nm, about 30-80 nm, about 30-70 nm, or about 30-60 nm. In this embodiment, since the quantum dot 40 has a spherical structure, the maximum diameter obtained by using the same way as the quantum dot 20 will be the same as the average diameter of the quantum dot 40. By including the transparent layer 401, the resistance or tolerance of the quantum dots 40 to the environmental damage factors can be further enhanced, thereby further improving the reliability or luminous life of the quantum dots 40.

The quantum dot 20 shown in FIG. 2 is used in FIG. 5 as an example. In FIG. 5, a first transparent layer 501 encapsulating the second shell 203 and a second transparent layer 503 encapsulating the first shell 205 are further formed on the quantum dot 20 shown in FIG. 2 to form the quantum dot 50, but the present disclosure is not limited to this. In some embodiments, the quantum dots 50 may be formed by further forming a first transparent layer 501 encapsulating the second shell 203 and a second transparent layer 503 encapsulating the first shell 205 are further formed on the quantum dot 30 shown in FIG. 3. In some embodiments, the first transparent layer 501 is formed conformally on the second shell 203 and encapsulates the second shell 203. The second transparent layer 503 is formed conformally on the first shell 205 and encapsulates the first shell 205. Therefore, the quantum dot 50 with the first transparent layer 501 and the second transparent layer 503 still has an irregular outer surface, as shown in FIG. 5. In some embodiments, the second transparent layer 503 is in the first transparent layer 501. The material and thickness of the first transparent layer 501 and the second transparent layer 503 may be the same as the material and thickness of the transparent layer 401, so they will not be repeated here. In some embodiments, the quantum dots 50 may have a maximum diameter greater than or equal to 9 nm and less than or equal to 140 nm, i.e., a maximum diameter of about 9-140 nm. In some embodiments, the quantum dot 50 may have a maximum diameter of about 12-140 nm, about 15-130 nm, about 20-125 nm, about 25-100 nm, about 30-90 nm, about 30-80 nm, about 30-70 nm, or about 30-60 nm. The expression "maximum diameter length of the quantum dot 50" indicates the longest length obtained by using the same way as the quantum dot 20, so they will not be repeated here. By including the first transparent layer 501 and the second transparent layer 503, the resistance or tolerance of the quantum dots 50 to the environmental damage factors in can be further enhanced, thereby further improving the reliability or luminous life of the quantum dots 50.

Figure 6:
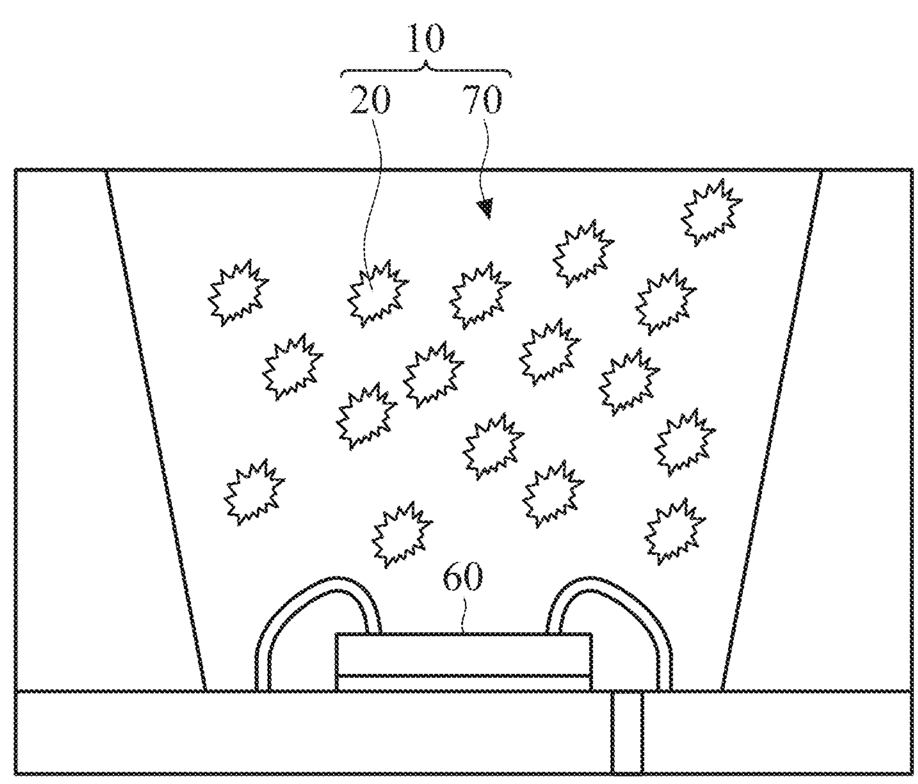
FIG. 6 illustrates a schematic view of a light-emitting device according to some embodiments of the present disclosure.

The above quantum dots 20, 30, 40 and 50 can be used in a light-emitting device to provide better reliability and a longer lifetime. FIG. 6 illustrates a schematic view of a light-emitting device 2 according to some embodiments of the present disclosure. As shown in FIG. 6, the light-emitting device 2 is an LED light-emitting device including a light source 60 and a wavelength conversion component 10. The light source 60 may be a light-emitting diode chip, which may emit a first light having a first wavelength. The wavelength conversion component may absorb part of the first light emitted by the light source 60 and convert the part of the first light into a second light having a second wavelength. In some embodiments, the first wavelength is different from the second wavelength. The wavelength conversion component 10 may include a matrix 70 and quantum dots 20 uniformly dispersed in the matrix 70, but the present disclosure is not limited thereto. In some embodiments, some or all of the quantum dots in the wavelength conversion component 10 may be replaced by one or more of the quantum dots 30-50 described above. The matrix 70 may comprise a transparent resin, such as acrylate resins, organosilicone resins, acrylate modified polyurethanes, acrylate modified organosilicone resins, or epoxy resins. In some embodiments, the wavelength conversion component 10 may further comprise diffusing particles uniformly dispersed in the matrix 70. The diffusing particles scatter the first light incident into the matrix 70, thereby increasing the path of the first light through the wavelength conversion component 10. The diffusing particles may include inorganic particles, organic polymeric particles, or any combination thereof. Examples of the inorganic particles include, but are not limited to, silicon oxides, titanium oxides, aluminum oxides, calcium carbonates, barium sulfates, or any combination thereof. Examples of organic polymeric particles include, but are not limited to, polymethyl methacrylate (PMMA), polystyrene (PS), acrylonitrile-butadiene-styrene copolymer (ABS), polyurethane (PU), or any combination thereof.

In some embodiments, the light-emitting device 2 may be a chip-level package (CSP) structure, wherein the light source 60 is a flip chip light-emitting diode chip and the wavelength conversion component 10 is a quantum dot film. The wavelength conversion component 10 encapsulates a top surface of the light-emitting diode chip or encapsulates the top surface and side surfaces of the light-emitting diode chip. The quantum dot film comprises one or more quantum dots selected from the group consisting of quantum dots 20, 30, 40, and 50.

In some embodiments, the light-emitting device 2 may be a white light-emitting device. In the white light-emitting device 2, the quantum dots 20 contain red quantum dots and green quantum dots, and the light source 60 may be a blue light-emitting diode chip; or the quantum dots 20 contain red quantum dots, green quantum dots, and blue quantum dots, and the light source 60 is a UV light-emitting diode chip. The present disclosure provides a backlight unit containing a plurality of the aforementioned white light-emitting devices 2. The present disclosure provides a display device containing the aforementioned backlight unit.

Further, the quantum dots 20, 30, 40, and 50 could be used in a quantum dot layer (QD layer), wherein the quantum dot layer comprises a transparent matrix and quantum dots selected from the group consisting of the quantum dots 20, 30, 40, and 50. The transparent matrix may include, for example, acrylate resins, organosilicone resins, acrylate modified polyurethanes, acrylate modified silicone resins, or epoxy resins. In addition, the quantum dot layer can be applied to liquid crystal displays.

In order to make the above and other purposes, features, and advantages of the present disclosure more apparent and understandable, several example and comparative examples of preparing quantum dots are given below. In these examples, the quantum dots are used to prepare light-emitting devices. The light-emitting devices are burned in without blocking moisture and oxygen and in a nitrogen environment without moisture and oxygen to observe the tolerance and reliability of the quantum dots to oxygen or moisture. These examples may specify the properties of the quantum dots formed by the method of forming quantum dots according to some embodiments of the present disclosure, the effects achieved by the quantum dots according to some embodiments of the present disclosure, and the properties of the light-emitting devices according to some embodiments of the present disclosure. However, the following examples and comparative examples are for illustrative purposes only and should not be construed as limitations on the implementation of this disclosure.

Preparation of Core Solution

<First Core Precursor Solution>

64 mg of cadmium oxide (CdO), 1615 mg of zinc oxide (ZnO), 20 mL of oleic acid (OA) and 80 mL of 1-octadecene (ODE) were placed in a 250 mL three-necked round-bottom flask to form a mixture. The mixture was heated at 150° C. for about 120 min while pumping at 100 mTorr, and nitrogen or inert gas was introduced into the three-necked flask to obtain 4 equivalents of cadmium-zinc (Cd—Zn) solution as the first core precursor solution.

<Second Core Precursor Solution>

655 mg of selenium (Se) powder, 148 mg of sulfur (S) powder, and 8 g of trioctylphosphine (TOP) were placed in a beaker to obtain a mixture, stirred and clarified, and sealed with nitrogen to obtain a selenium-sulfur mixture as a second core precursor solution.

Preparation of Shell Precursor Solution

<First Shell Precursor Solution>

5.6 g of anhydrous zinc acetate, 4 g of oleic acid (OA), and 20 g of 1-octadecene (ODE) were placed in a 50 mL three-necked round-bottom flask, heated to 150° C. for about 30 min, clarified, and then sealed with nitrogen to obtain a 0.7 equivalent of Zn-OA solution as the first chitin precursor solution.

<Second Shell Precursor Solution>

352 mg of sulfur powder and 5.5 g of trioctylphosphine (TOP) were placed in a beaker, stirred and clarified, and sealed by passing nitrogen to obtain 1 equivalent of S-TOP solution as a second shell precursor solution.

Preparation of Quantum Dot 1 equivalent of the first core precursor solution was heated to 280° C. and reacted for 3 minutes. 1 equivalent of the second core precursor solution was injected into the heated first core precursor solution and then heated to 320° C. and reacted for 10 minutes to form a core solution. The second shell precursor solution was injected into the core solution and reacted for 10 minutes. Then, the core solution was cooled to 250° C. 1 equivalent of the first chitosan precursor solution was injected into the core solution at the injection rate listed in Table 1 below. 1 equivalent of the second shell precursor solution was injected into the core solution at an injection rate of 0.9 eq/min to obtain a quantum dot precursor solution. The quantum dot precursor solution was heated at 250° C. for 90 minutes to synthesize quantum dots. The solution containing the quantum dots was cooled to room temperature, and repeated to be washed with 100 mL of methanol/80 mL of toluene for four times, and then the quantum dot solution was centrifugated to obtain the purified quantum dots of Examples 1 to 5.

Figure 7:
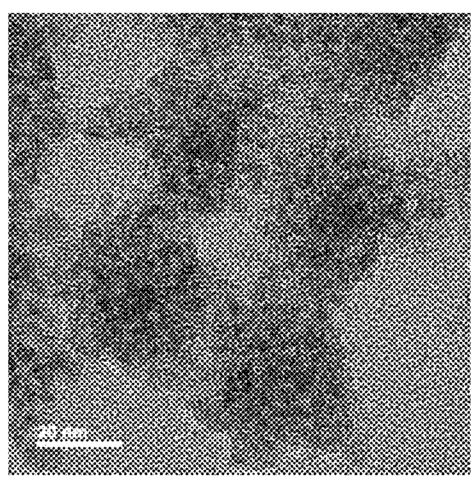
FIG. 7 is a transmission electron microscope (TEM) image of quantum dots according to some embodiments of the present disclosure.
Figure 8:
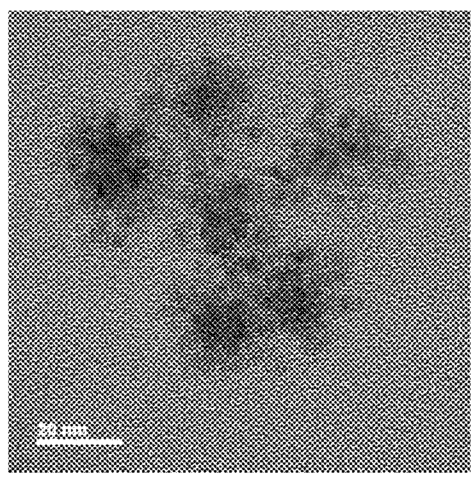
FIG. 8 is a TEM image of quantum dots according to some embodiments of the present disclosure.
Figure 9:
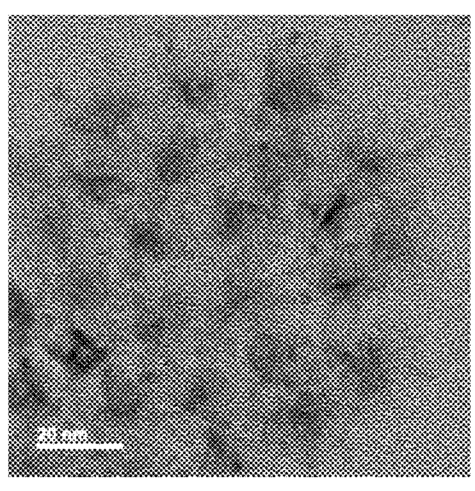
FIG. 9 is a TEM image of quantum dots according to some embodiments of the present disclosure.
Figure 10:
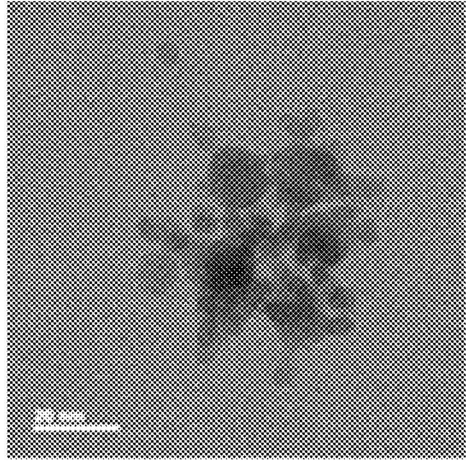
FIG. 10 is a TEM image of quantum dots according to some embodiments of the present disclosure.
Figure 11:
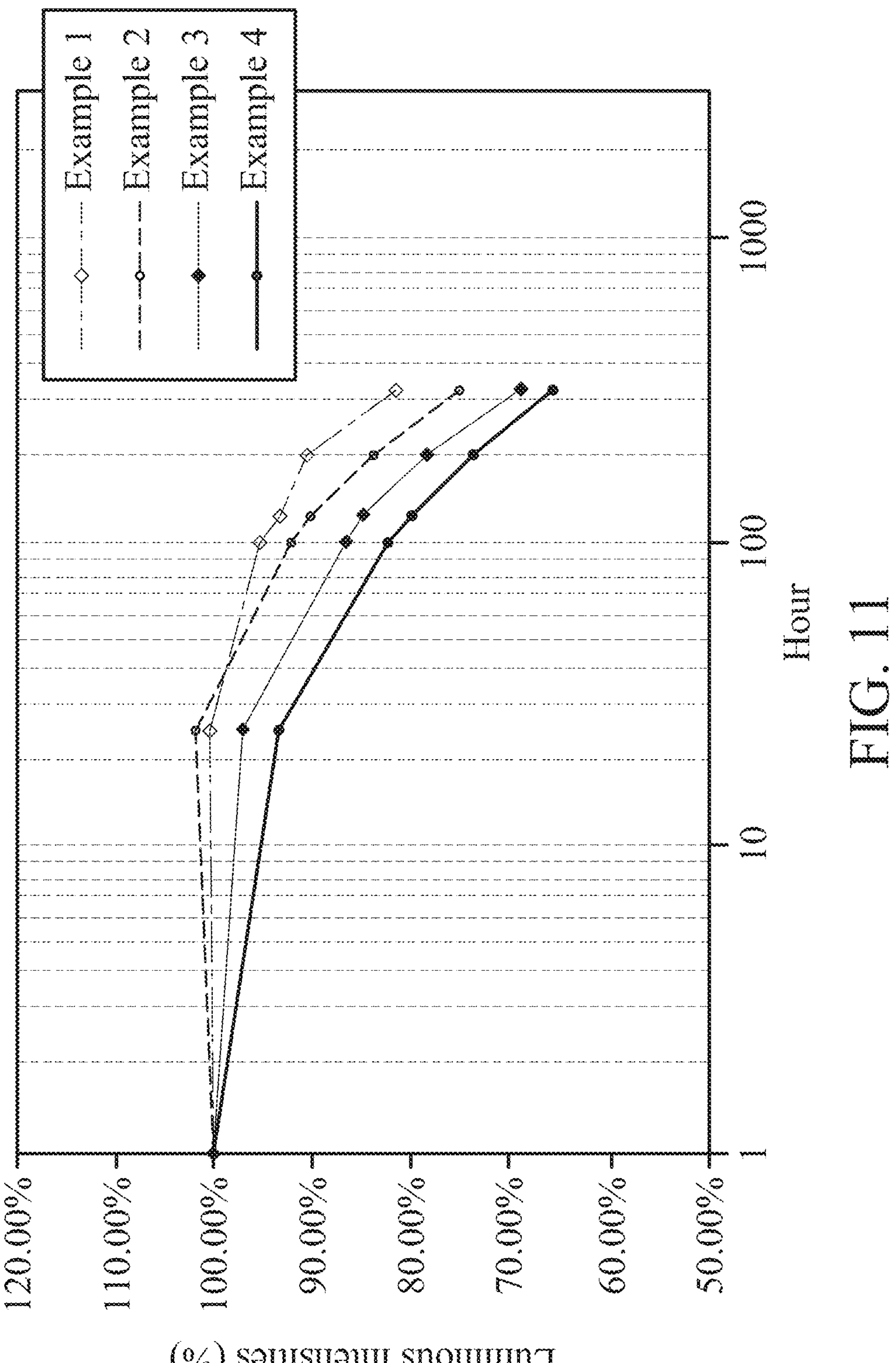
FIG. 11 is a folding line diagram which shows the luminescence intensities of the quantum dots of the example of the present disclosure as a function of time.

The structures of the quantum dots of Examples 1 to 5 were analyzed by a transmission electron microscope (TEM, manufactured by JEOL, Japan, model JEM-2100F). FIG. 7 is a transmission electron microscope (TEM) image of the quantum dots of Example 1 of the present disclosure. FIG. 8 is a TEM image of the quantum dots of Example 2. FIG. 9 is a TEM image of the quantum dots of Example 3. FIG. 10 is a TEM image of the quantum dots of Example 4. The quantum efficiency of the quantum dots of Example 5 is too low to take a TEM image. The maximum diameters of the quantum dots of Examples 1 to 5 were measured according to FIGS. 7 to 10. The quantum efficiencies of the quantum dots of Examples 1 to 5 were measured by a fluorescence spectrometer (Fluoromax-4 Spectrofluorometer). The luminous intensities of the light-emitting diodes containing the quantum dots of Examples 1 to were measured by a luminance measuring instrument (WeiMin Industrial/Model 6122) and the resulting data was used to produce a folding line diagram as shown in FIG. 11. The injection rates of the first shell precursor solution in the preparation of the quantum dots of Examples 1 to and the maximum diameters and the quantum efficiencies of the quantum dots of Examples 1 to 5 are shown in Table 1 below. Here, the maximum diameter of the quantum dot is averaged over a random sample of 50 quantum dots.

TABLE 1

| | Example 1 | Example 2 | Example 3 | Example 4 | Example 5 |
|---|---|---|---|---|---|
| Injection rate of the first chitosan precursor solution (eq/min) | 0.38 | 0.69 | 1.5 | 15 | 0.2 |
| Maximum diameter (nm) | 36.5 ± 3.4 | 27.2 ± 3.7 | 18.3 ± 1.8 | 10.8 ± 3.8 | — |
| Quantum efficiency (%) | 65 | 65 | 75 | 90 | <40 |

As can be seen from Table 1 in conjunction with FIGS. 7 to 10, when the injection rate of the first shell precursor solution is too fast, the maximum diameter of the formed quantum dots is smaller, the gap between the shells is larger, and the shells do not cluster around the core. From Table 1, it can be further seen that the quantum efficiencies of the quantum dots decrease when the injection rate of the first shell precursor solution becomes slower. The quantum efficiency is below 40 when the injection rate is 0.20 eq/min. FIG. 11 is a folding line diagram which shows the luminescence intensities of the quantum dots of the example of the present disclosure as a function of time. It is clear from FIG. 11 that the decay of the luminescence of the quantum dots decreases when the injection rate of the first shell precursor solution becomes slower, which indicates that the slower the injection rate of the first shell precursor solution, the lower the decay of the luminescence of the resulting quantum dots and the higher the reliability of the quantum dots.

Figure 12:
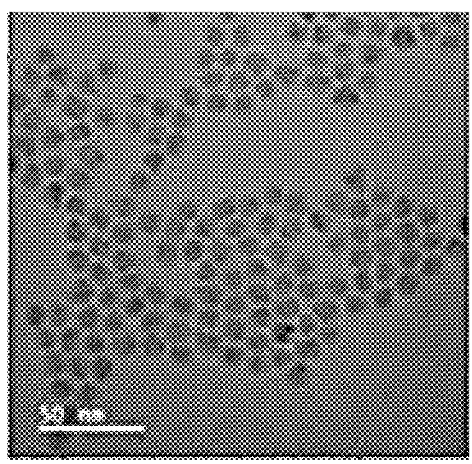
FIG. 12 is a TEM image of the quantum dots of Comparative Example.

Preparation of Quantum Dot of Comparative Example 1 equivalent of the first core precursor solution was heated to 280° C. and reacted for 3 minutes. 1 equivalent of the second core precursor solution was injected into the heated first core precursor solution and then heated to 320° C. and reacted for 10 minutes to form a core solution. The second shell precursor solution was injected into the core solution and reacted for 10 minutes. Then, the core solution was cooled to 250° C. 1 equivalent of the first shell precursor solution was rapidly injected into the core solution. 1 equivalent of the second shell precursor solution was injected into the core solution to obtain a quantum dot precursor solution. The quantum dot precursor solution was heated at 250° C. for 20 minutes to synthesize quantum dots. The solution containing the quantum dots was cooled to room temperature and repeated to be washed with 100 mL of methanol/80 mL of toluene for four times, and then the quantum dot solution was centrifugated to obtain the purified quantum dots of Comparative Example. The quantum efficiency of the quantum dots of Comparative Example was measured by a fluorescence spectrometer (Fluoromax-4 Spectrofluorometer). The quantum efficiency of the quantum dots of Comparative Example was 65%. The structure of the quantum dots of Comparative Example was analyzed by a transmission electron microscope (TEM, manufactured by JEOL, Japan, model JEM-2100F). FIG. 12 is a TEM image of the quantum dots of Comparative Example. It can be seen from FIG. 12 that the shell of the quantum dot of Comparative Example is smooth and the shell of the quantum dot of Comparative Example does not have a discontinuous position around the core surface of the core. The maximum diameter of the quantum dot of Comparative Example is 11.6±1.6 nm as measured in FIG. 12.

Preparation of Light-Emitting Devices

The quantum dots of Example 1 and the quantum dots of Comparative Example were coated on a blue light-emitting diode chip with a wavelength of about 450-460 nm, an optical power of about 34.6 mW and a wafer size of about 0.35*0.70 mm after mixed with an organosilicone resin to obtain a light-emitting device of Example and a light-emitting device of Comparative Example.

Performance Testing of Light-Emitting Devices

Figure 13:
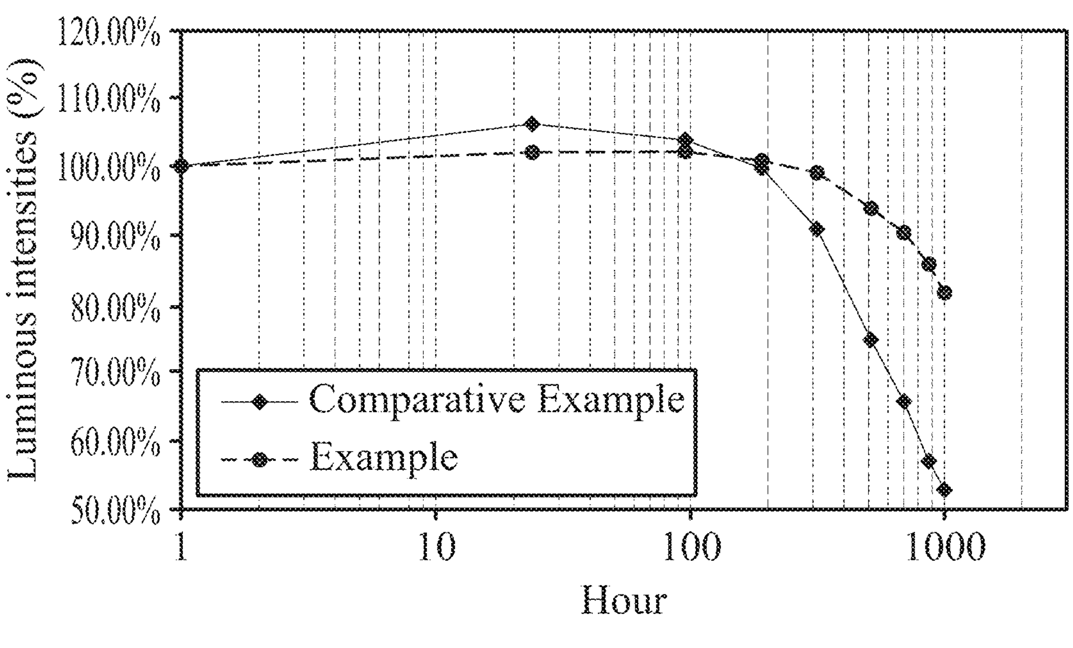
FIG. 13 is a folding line diagram which shows the luminescence intensities of the light-emitting devices of Example and Comparative Example of the present disclosure in a nitrogen environment as a function of time.
Figure 14:
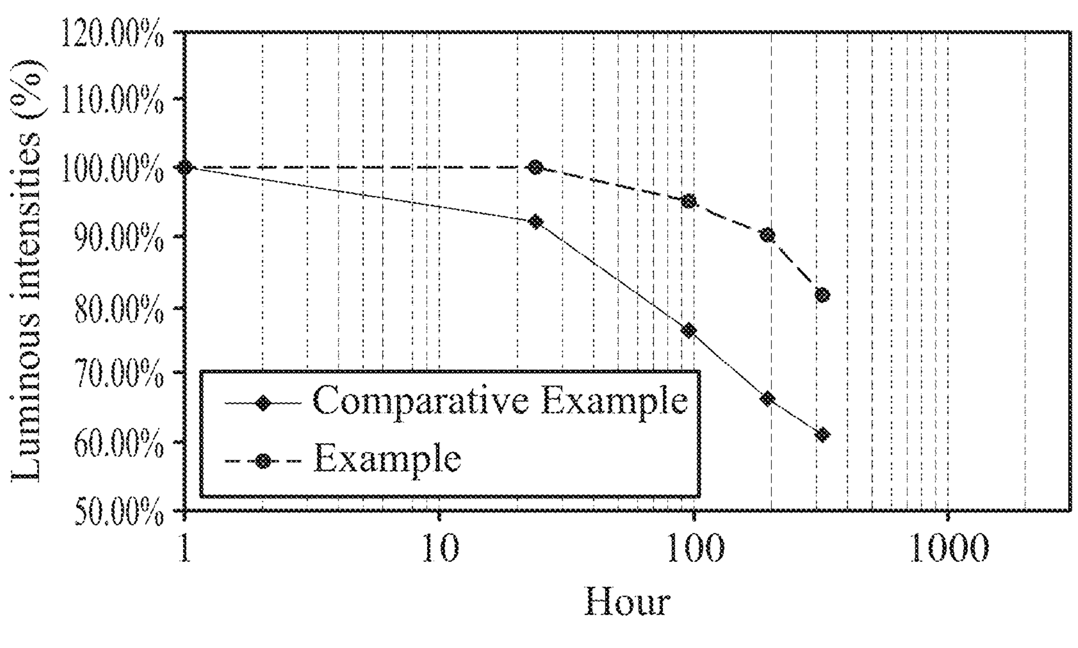
FIG. 14 is a folding line diagram which shows the luminescence intensities of the light-emitting devices of Example and Comparative Example of the present disclosure in a general environment as a function of time.

The light-emitting device of Example and the light-emitting device of Comparative Example were lit for about 100 hours in a general environment without blocking moisture and oxygen at a current of 20 mA, a drive voltage of 3.0 V, and a continuous lighting current of 15 mA. The light-emitting device of Example and the light-emitting device of Comparative Example were lit for about 1000 hours in a nitrogen environment without water and oxygen. The degree of luminous intensities of light-emitting device of Example and the light-emitting device of Comparative Example which decay over time were measured by a luminance measuring instrument (WeiMin Industrial/Model 6122) and the resulting data was used to produce folding line diagrams as shown in FIGS. 13 and 14. FIG. 13 is a folding line diagram which shows the luminescence intensities of the light-emitting devices of Example of the present disclosure and Comparative Example in a nitrogen environment as a function of time. FIG. 14 is a folding line diagram which shows the luminescence intensities of the light-emitting devices of Example of the present disclosure and Comparative Example in a general environment as a function of time.

As can be seen in FIG. 13, compared with the initial luminous intensity of the light-emitting device of Comparative Example, the luminous intensity of the light-emitting device of Comparative Example is reduced by about 50% after 1000 hours of lighting in a nitrogen environment. However, compared with the initial luminous intensity of the light-emitting device of Example, the luminous intensity of the light-emitting device of Example is reduced by about 20% after 1000 hours of lighting in a nitrogen environment. As can be seen in FIG. 14, compared with the initial luminous intensity of the light-emitting device of Comparative Example, the luminous intensity of the light-emitting device of Comparative Example is reduced by about 20% after 100 hours of lighting in a general environment. However, compared with the initial luminous intensity of the light-emitting device of Example, the luminous intensity of the light-emitting device of Example is reduced by no more than 10% after 100 hours of lighting in a general environment. From the above experimental results, it is obvious that the light-emitting device of Example has better reliability or longer luminous life than the light-emitting device of Comparative Example, whether in a nitrogen environment or a general environment. In other words, compared with the quantum dots of Comparative Example with smooth shells, the quantum dots of the present disclosure have higher resistance to or better tolerance to the damage factors in the environment. Therefore, the quantum dots of the present disclosure have better reliability or longer luminous life.

The components of the embodiments are outlined above so that those having ordinary knowledge in the art to which the present disclosure belongs may better understand the perspective of the embodiments of the present disclosure. Those having ordinary knowledge in the art to which the present disclosure belongs should understand that they can design or modify other processes or structures based on the embodiments of the present disclosure to achieve the same purposes and/or advantages as the embodiments described herein. Those having ordinary knowledge in the art to which the present disclosure belongs should also understand that such equivalent structures are not inconsistent with the spirit and scope of this disclosure, and that they can make various changes, substitutions, and replacements without violating the spirit and scope of this disclosure. Therefore, the scope of protection of this disclosure is defined by the scope of the claim attached hereto. In addition, although several preferred embodiments are disclosed in the present disclosure, they are not intended to limit this disclosure.

Terms such as "features", "benefits", and the like introduced throughout the specification are not all features and benefits that can be achieved by using the present disclosure and should/could not be achieved in any single embodiment of the present disclosure. In contrast, the terms relating to features and benefits are understood to mean that the particular features, benefits, or characteristics described in conjunction with the embodiments are included in at least one embodiment of the present disclosure. Thus, the discussion of the terms "features", "benefits", and the like throughout the specification may, but does not necessarily, represent the same embodiment.

Further, the features, benefits, and characteristics described in the present disclosure may be combined in any suitable manner in one or more embodiments. According to the description herein, those having ordinary knowledge in the art to which the present disclosure belongs will realize that the present disclosure can be implemented without one or more of particular features or benefits of a particular embodiment. In other instances, additional features and benefits may be shown in some embodiments while they may not be shown in all embodiments of the present disclosure.

What is claimed is:

1. A quantum dot, comprising:

a core having a core surface;

a first shell comprising a first particle and a second particle that are distributed around the core surface;

a second shell arranged between the core and the first shell, and having an inner surface and an outer surface with a peak; and a first transparent layer encapsulating the second shell, wherein, in a cross sectional view, the core surface and the inner surface have an identical shape, the first particle and the second particle are completely separated by the peak.

2. The quantum dot as claimed in claim 1, further comprising a gap between the first shell and the second shell, wherein the gap is greater than or equal to 0 nm and less than or equal to 10 nm.

3. The quantum dot as claimed in claim 2, wherein the sum of a thickness of the first shell, a thickness of the second shell, and the gap is greater than 0 nm and less than or equal to 35 nm.

4. The quantum dot as claimed in claim 1, wherein the irregularly shaped outer surface of the second shell is a concave-and-convex outer surface, and a height difference between the lowest point and the highest point in the concave-and-convex outer surface is greater than 0 nm and less than or equal to 5 nm.

5. The quantum dot as claimed in claim 4, wherein the concave-and-convex outer surface has a recessed portion having a recessed width, and the recessed width is greater than 0 nm and less than or equal to 10 nm.

6. The quantum dot as claimed in claim 1, further comprising a ligand on the outer surface of the second shell.

7. The quantum dot as claimed in claim 1, wherein the first transparent layer has an irregularly shaped outer surface.

8. The quantum dot as claimed in claim 7, further comprising a second transparent layer in the first transparent layer and encapsulating the first shell.

9. The quantum dot as claimed in claim 1, wherein the first shell and the second shell have the same materials.

10. A light-emitting device, comprising:

a light source emitting a first light; and a wavelength conversion component absorbing part of the first light and converting the part of the first light into a second light, wherein the wavelength conversion component comprises a quantum dot as claimed in claim 1.

11. The quantum dot as claimed in claim 1, wherein the maximum diameter length of the quantum dot is less than or equal to 140 nm.

* * * * *